(12) United States Patent
Koh et al.

(10) Patent No.: US 8,247,272 B2
(45) Date of Patent: Aug. 21, 2012

(54) COPPER ON ORGANIC SOLDERABILITY PRESERVATIVE (OSP) INTERCONNECT AND ENHANCED WIRE BONDING PROCESS

(75) Inventors: Yong Chuan Koh, Singapore (SG); Jimmy Siat, Singapore (SG); Jeffrey Nantes Salamat, Singapore (SG); Lope Vallespin Pepito, Jr., Singapore (SG); Ronaldo Cayetano Calderon, Singapore (SG); Rodel Manalac, Singapore (SG); Pang Hup Ong, Singapore (SG); Kian Teng Eng, Compass Heights (SG)

(73) Assignee: United Test and Assembly Center Ltd., Singapore (SG)

( * ) Notice: Subject to any disclaimer, the term of this patent is extended or adjusted under 35 U.S.C. 154(b) by 150 days.

(21) Appl. No.: 12/489,409

(22) Filed: Jun. 22, 2009

(65) Prior Publication Data

US 2010/0025849 A1  Feb. 4, 2010

Related U.S. Application Data

(63) Continuation-in-part of application No. 11/965,252, filed on Dec. 27, 2007, now abandoned.

(60) Provisional application No. 61/074,154, filed on Jun. 20, 2008.

(51) Int. Cl.
*H01L 21/00* (2006.01)
*H01L 21/44* (2006.01)

(52) U.S. Cl. .................................... 438/123; 438/617

(58) Field of Classification Search ................. 438/123, 438/617
See application file for complete search history.

(56) References Cited

U.S. PATENT DOCUMENTS

| | | | | |
|---|---|---|---|---|
| 5,559,054 A | * | 9/1996 | Adamjee | 438/617 |
| 6,176,417 B1 | * | 1/2001 | Tsai et al. | 228/180.5 |
| 6,207,551 B1 | * | 3/2001 | Chungpaiboonpatana et al. | 438/617 |
| 6,689,679 B2 | * | 2/2004 | Koyama | 438/613 |
| 6,946,380 B2 | * | 9/2005 | Takahashi | 438/612 |
| 7,049,177 B1 | * | 5/2006 | Fan et al. | 438/123 |
| 7,229,906 B2 | * | 6/2007 | Babinetz et al. | 438/617 |
| 7,285,854 B2 | * | 10/2007 | Ishikawa et al. | 257/738 |
| 7,314,818 B2 | * | 1/2008 | Takahashi et al. | 438/612 |
| 2004/0041241 A1 | * | 3/2004 | Vo et al. | 257/666 |
| 2007/0052076 A1 | * | 3/2007 | Ramos et al. | 257/676 |
| 2007/0199974 A1 | * | 8/2007 | Babinetz et al. | 228/32 |
| 2008/0116591 A1 | * | 5/2008 | Hayashi et al. | 257/784 |
| 2008/0136027 A1 | * | 6/2008 | Moon et al. | 257/738 |
| 2008/0246129 A1 | * | 10/2008 | Oga | 257/673 |
| 2008/0272487 A1 | * | 11/2008 | Shim et al. | 257/737 |
| 2009/0065914 A1 | * | 3/2009 | Engl et al. | 257/676 |
| 2009/0243057 A1 | * | 10/2009 | Feng et al. | 257/670 |

* cited by examiner

*Primary Examiner* — James Mitchell
(74) *Attorney, Agent, or Firm* — Horizon IP Pte Ltd

(57) ABSTRACT

A semiconductor package and a method for constructing the package are disclosed. The package includes a substrate and a die attached thereto. A first contact region is disposed on the substrate and a second contact region is disposed on the die. The first contact region, for example, comprises copper coated with an OSP material. A copper wire bond electrically couples the first and second contact regions. Wire bonding includes forming a ball bump on the first contact region having a flat top surface. Providing the flat top surface is achieved with a smoothing process. A ball bond is formed on the second contact region, followed by stitching the wire onto the flat top surface of the ball bump on the first contact region.

15 Claims, 20 Drawing Sheets

2000

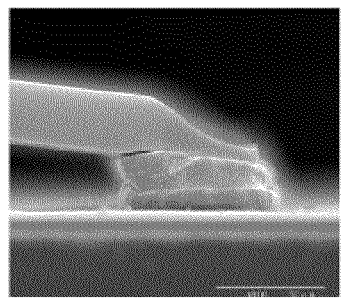 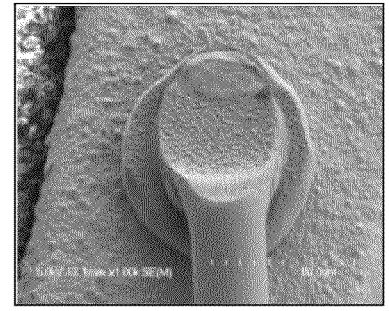
Fig. 10aFig. 10b
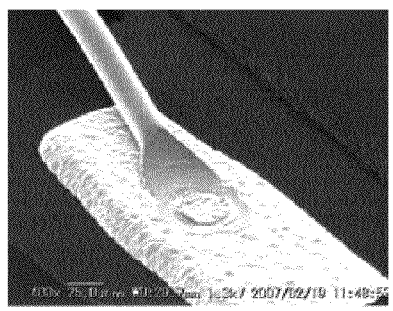 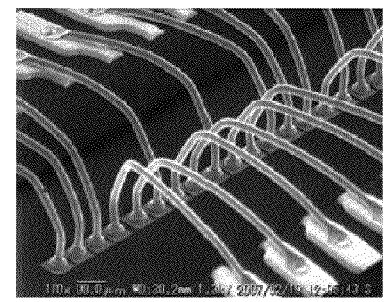
Fig. 11aFig. 11b
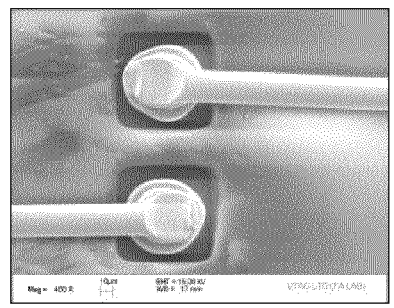 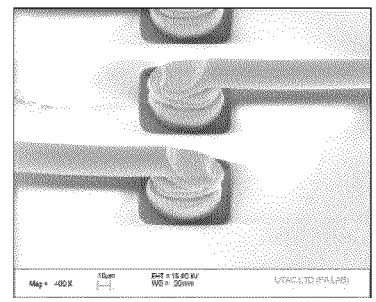
Fig. 12aFig. 12b

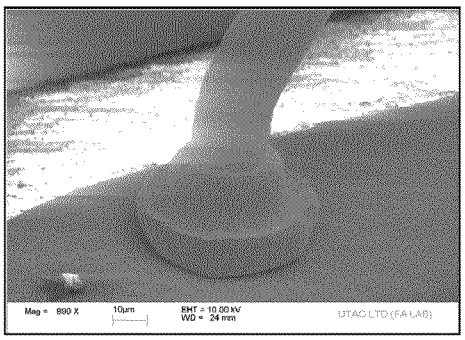 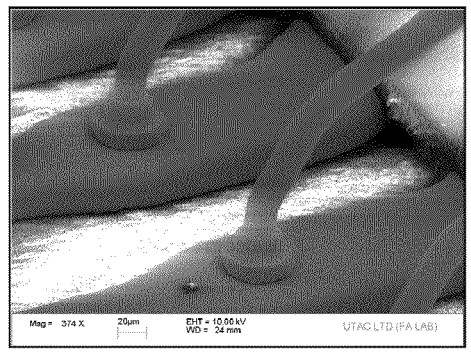
Fig. 13a  Fig. 13b
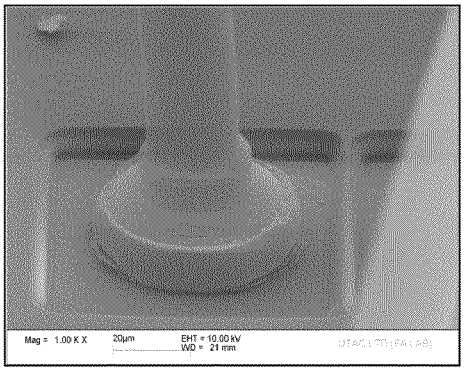 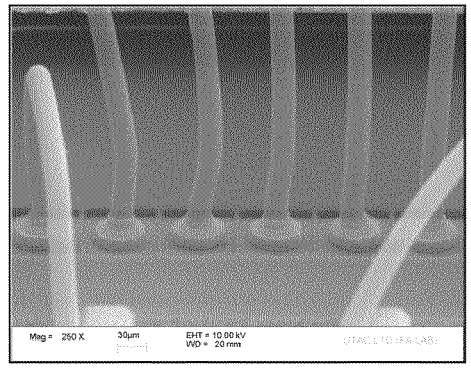
Fig. 14a  Fig. 14b
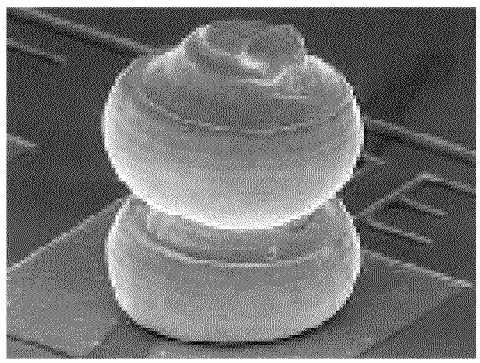 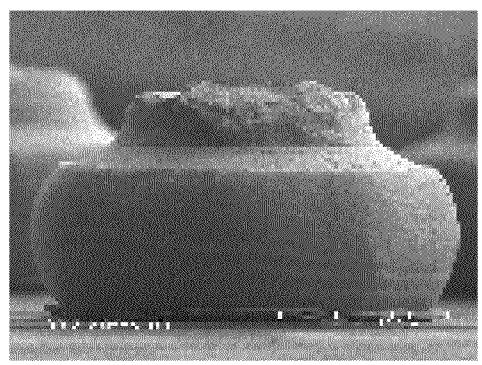
Fig. 15a  Fig. 15b

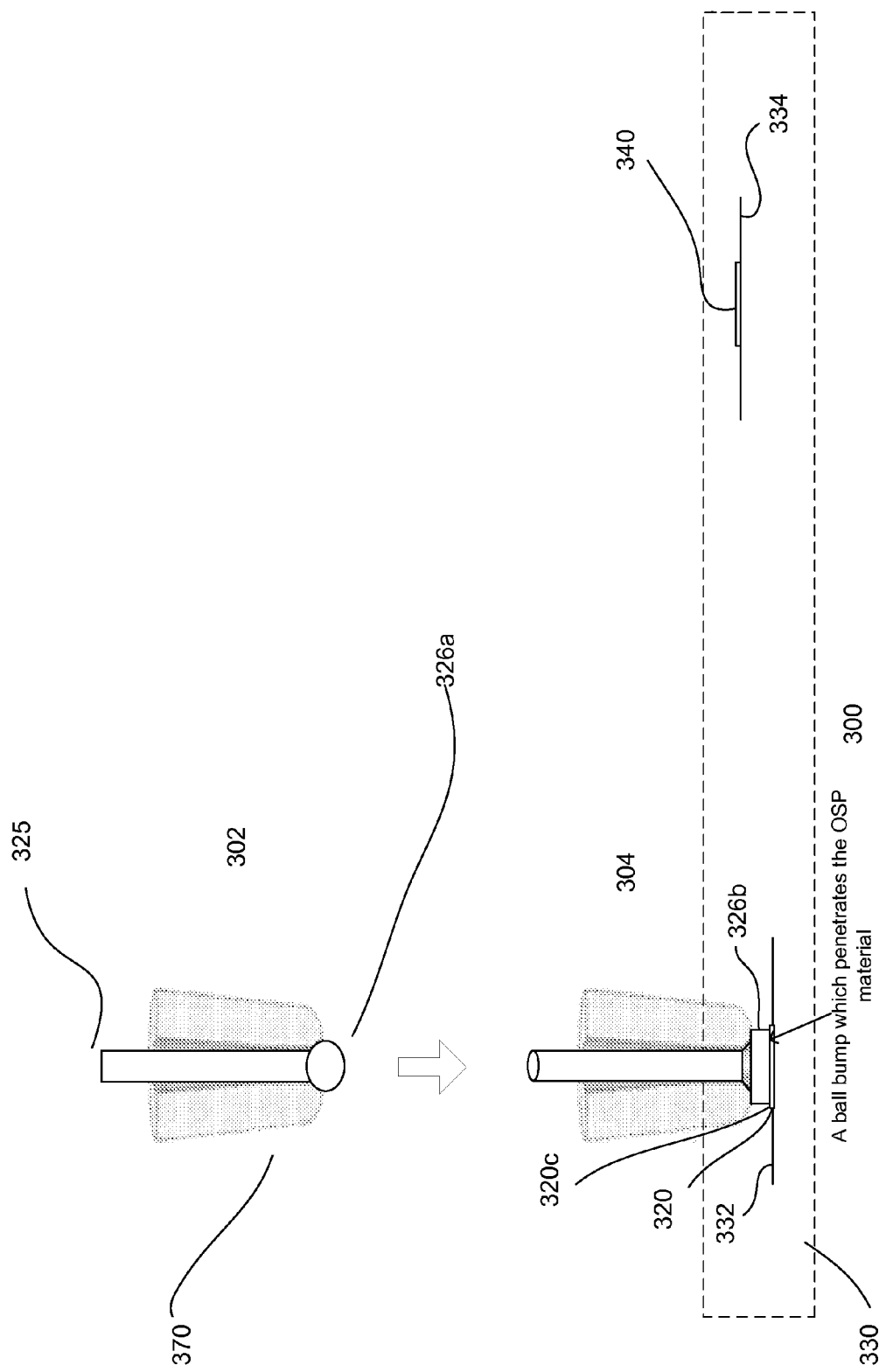

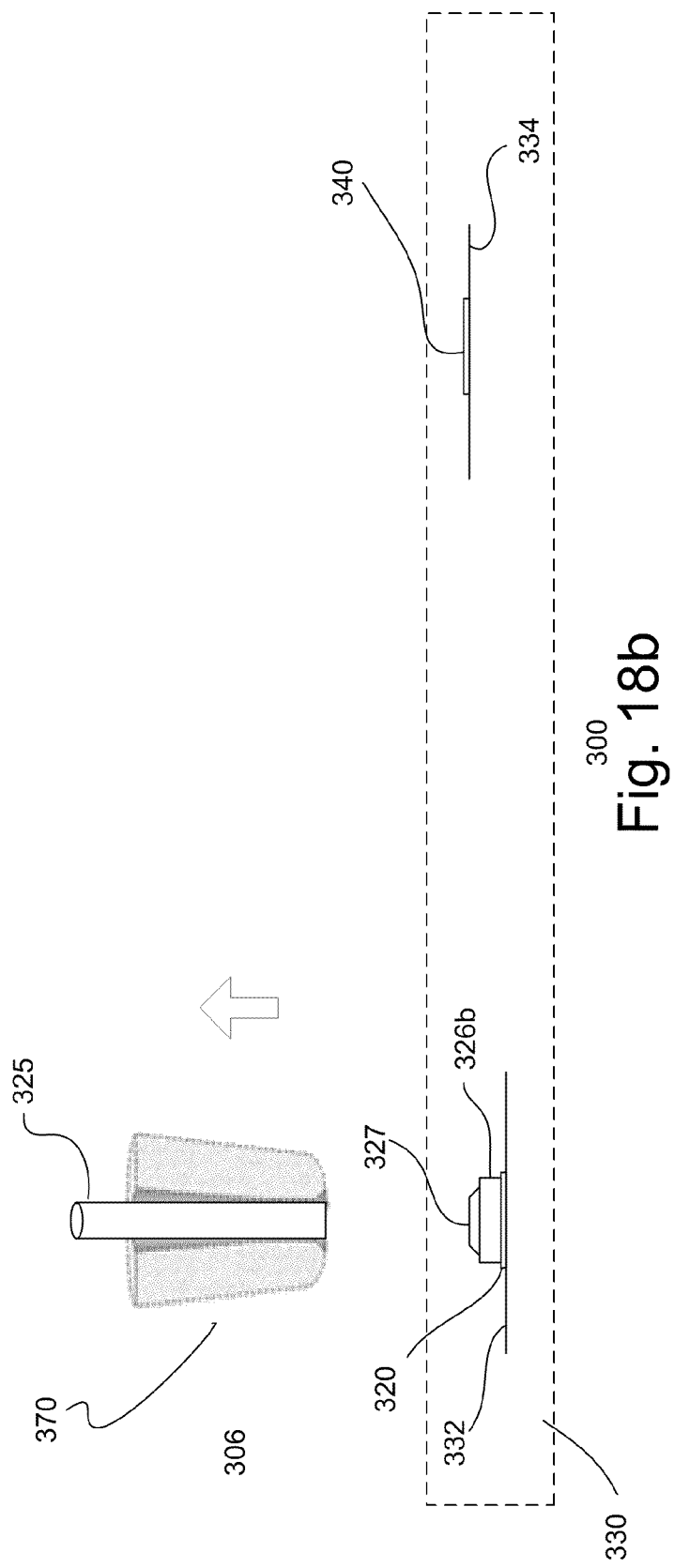

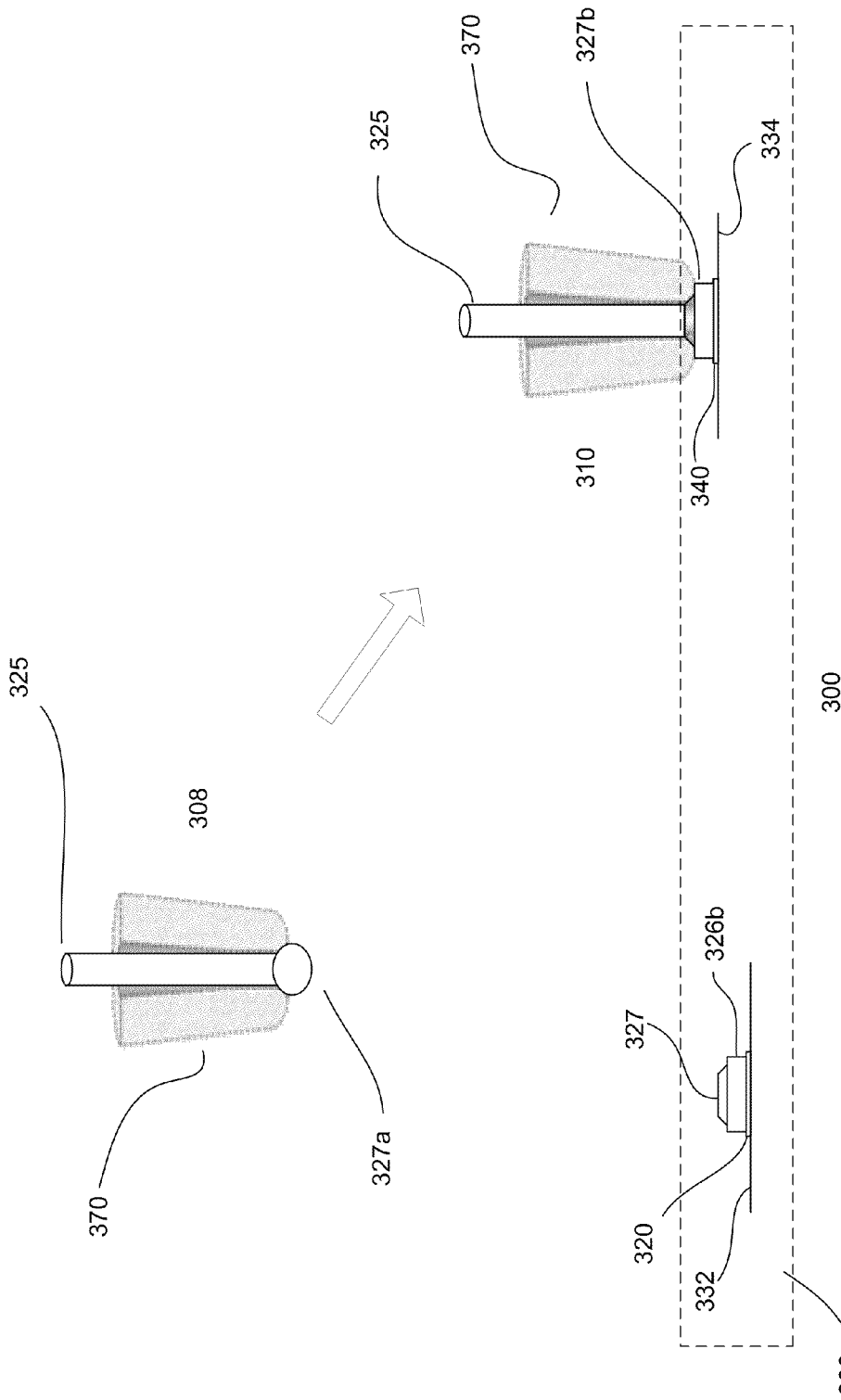

|   | Ball Shear ||Bump Size || Bump Height | Ball Shear || SSB Size || SSB Height |
|   | w/o NVT | w/ NVT | X | Y |  | w/o NVT | w/ NVT | X | Y |  |
|---|---|---|---|---|---|---|---|---|---|---|
| 1 | 24.45 | 26.14 | 43 | 46 | 16 | 34.38 | 36.4 | 50 | 54 | 12 |
| 2 | 24.68 | 25.32 | 41 | 45 | 15 | 35.53 | 37.88 | 50 | 54 | 13 |
| 3 | 27.87 | 25.96 | 43 | 46 | 16 | 37.65 | 36.43 | 49 | 52 | 13 |
| 4 | 26 | 26.45 | 43 | 45 | 16 | 34.45 | 36.1 | 48 | 54 | 13 |
| 5 | 26.18 | 24.86 | 43 | 44 | 16 | 35.2 | 35.49 | 49 | 54 | 12 |
| 6 | 27.63 | 27.79 | 43 | 45 | 17 | 34.41 | 36.66 | 49 | 54 | 12 |
| 7 | 26 | 26.35 | 44 | 43 | 16 | 34.67 | 35.16 | 48 | 52 | 13 |
| 8 | 26.21 | 26.32 | 43 | 44 | 15 | 35.48 | 33.99 | 50 | 53 | 13 |
| 9 | 25.52 | 26.9 | 43 | 45 | 16 | 33.64 | 33.6 | 49 | 51 | 12 |
| 10 | 27.05 | 26 | 44 | 43 | 15 | 33.22 | 33.99 | 49 | 52 | 12 |
| 11 | 26.78 | 27.09 | 44 | 46 | 16 | 34.16 | 32.11 | 51 | 51 | 12 |
| 12 | 26.24 | 27.21 | 43 | 43 | 16 | 34.91 | 33.28 | 50 | 54 | 12 |
| 13 | 25.52 | 26.35 | 44 | 45 | 15 | 35.82 | 32.75 | 50 | 53 | 13 |
| 14 | 25.47 | 25.85 | 44 | 41 | 16 | 37.57 | 33.1 | 51 | 51 | 12 |
| 15 | 25.7 | 25.35 | 43 | 43 | 16 | 36.41 | 34.5 | 49 | 52 | 12 |
| 16 | 25.95 | 25.72 | 44 | 44 | 16 | 33.24 | 33.71 | 49 | 52 | 13 |
| 17 | 23.98 | 27.18 | 43 | 44 | 16 | 34.68 | 32.5 | 50 | 53 | 13 |
| 18 | 24.56 | 26.49 | 44 | 46 | 16 | 35.87 | 33.55 | 52 | 53 | 12 |
| 19 | 26.14 | 26.09 | 44 | 44 | 16 | 35.1 | 33.96 | 49 | 53 | 12 |
| 20 | 25.54 | 26.88 | 43 | 44 | 15 | 34.27 | 31.91 | 48 | 52 | 13 |
| 21 | 25.59 | 26.77 |  |  |  | 32.64 | 33.12 |  |  |  |
| 22 | 25.07 | 27.09 |  |  |  | 35.03 | 33.59 |  |  |  |
| 23 | 25.01 | 25.91 |  |  |  | 33.22 | 36.06 |  |  |  |
| 24 | 24.02 | 25.99 |  |  |  | 34.24 | 36.05 |  |  |  |
| 25 | 23.97 | 25.91 |  |  |  | 34.01 | 34.16 |  |  |  |
| 26 | 24.69 | 25.23 |  |  |  | 34.11 | 32.41 |  |  |  |
| 27 | 24.83 | 26.11 |  |  |  | 32.92 | 33.98 |  |  |  |
| 28 | 24.44 | 25.27 |  |  |  | 29.97 | 35.13 |  |  |  |
| 29 | 26.26 | 26.96 |  |  |  | 33.86 | 33.96 |  |  |  |
| 30 | 25.03 | 26.15 |  |  |  | 35.48 | 31.96 |  |  |  |
| Ave | 25.55 | 26.26 | 43.30 | 44.30 | 15.80 | 34.54 | 34.25 | 49.50 | 52.70 | 12.45 |
| Stdev | 1.01 | 0.69 | 0.73 | 1.30 | 0.52 | 1.49 | 1.57 | 1.05 | 1.08 | 0.51 |
| Min | 23.97 | 24.86 | 41.00 | 41.00 | 15.00 | 29.97 | 31.91 | 48.00 | 51.00 | 12.00 |
| Max | 27.87 | 27.79 | 44.00 | 46.00 | 17.00 | 37.65 | 37.88 | 52.00 | 54.00 | 13.00 |
| CPK |  |  |  |  |  |  |  |  |  |  |

| | BALL SHEAR TEST ON BALL | | BALL SHEAR TEST ON BUMP | | STITCH PULL | | BALL SIZE X,Y,Z | | | | LOOP H | |
|---|---|---|---|---|---|---|---|---|---|---|---|---|
| | UNIT1 | UNIT2 | UNIT1 | UNIT2 | UNIT1 | UNIT2 | UNIT1 | UNIT2 | UNIT1 | UNIT2 | | |
| MIN | 25.40 | 24.40 | 21.50 | 35.70 | 18.40 | 17.50 | 50.00 | 50.00 | 10.00 | 10.00 | 34.00 | 31.00 |
| MAX | 28.70 | 27.50 | 45.80 | 46.70 | 19.70 | 19.60 | 52.00 | 52.00 | 11.00 | 11.00 | 45.00 | 46.00 |
| AVE | 26.68 | 25.98 | 41.35 | 44.04 | 18.93 | 18.62 | 50.80 | 50.90 | 10.50 | 10.60 | 38.30 | 38.30 |
| STD DEV | 1.664 | 1.550 | 12.938 | 5.739 | 0.654 | 1.051 | 1.007 | 1.002 | 0.500 | 0.503 | 5.543 | 7.501 |
| CPk | 1.94 | | 0.63 | | 0.98 | | 0.99 | | 2.27 | | 0.80 | |
| SPEC | 17gF | | | | 7 gf | | 47µm - 55µm | | 5µm - 14µm | | 25µm-70 µm | |

| Test Type | Test Condition | Duration | Result | Remarks |
|---|---|---|---|---|
| Moisture Sensitivity Level | MSL 3 (30°C / 60% RH, 3x Reflow @ 260°C) | 192 hours | (2/150) Passed | Non-assembly related rejects. |
| Temperature Cycling (TC) | - 55 °C to 125 °C | 500 cycles | (0/97) Passed | 100% passed |
| | | 1000 cycles | (0/97) Passed | 100% passed |
| High Temperature Storage (HTS) | 150°C | 500 hours | (0/50) Passed | 100% passed |
| | | 1000 hours | (0/50) Passed | 100% passed |

Fig. 24

COPPER ON ORGANIC SOLDERABILITY PRESERVATIVE (OSP) INTERCONNECT AND ENHANCED WIRE BONDING PROCESS

CROSS-REFERENCE TO RELATED APPLICATION

This application claims priority from U.S. patent application Ser. No. 11/965,252 filed on Dec. 27, 2007 and U.S. Provisional Application No. 61/074,154 filed on Jun. 20, 2008, the disclosures of which are incorporated herein by reference.

BACKGROUND

Wire bonding is generally a means of electrical connection between a semiconductor chip and a substrate. The substrate may, for example, be a printed circuit board (PCB) or a lead frame. Wire bonding typically involves using gold (Au) wire, aluminum (Al) wire, copper (Cu) wire, silver (Ag) wire, or a combination of alloy wire to form the electrical connection. One type of wire bond process, for example, is the Stand Off stitch on ball Bonding (SSB). An advantage of SSB is that it provides better loop control and can achieve a lower wire loop profile.

Au wire is commonly used as a form of electrical connection between the semiconductor chip and the substrate. Typically, the Au wire is bonded to an Al bond pad formed on the chip at one end, and bonded to the substrate at the other end. During bonding, the Au and Al inter-diffuse into each other and may result in high electrical resistance and high heat generation. This may then lead to low bonding reliability and device performance. Also, the poor heat dissipation characteristic of gold materials may cause overheating in the IC assembly.

Furthermore, Au materials have low tensile strength and may result in poor wire sagging, poor wire sweeping performance, poor wire loop profile and instability for long wires, during packing encapsulation. Also, in Au wire bonding, a process of Ni and Au coating on the substrate is required in order to achieve an acceptable electrical connection between the Au wire and the substrate.

In view of the foregoing disadvantages and the expensive cost of gold, other materials, for example, copper (Cu), have been contemplated for wire bonds. Particularly, copper, which has better conductivity as compared to gold materials, thereby increasing device power rating and improving package heat dissipation.

A challenge of using copper in wire bonding is that the bond pad surface on the chip or the lead finger surface on the substrate may have oxidized material coated thereon, which may decrease bonding reliability. For example, when wire bonding to a Cu bond pad, the Cu bond pad oxidizes readily to form a layer of oxide on the bond pad surface. The oxide layer prevents effective bonding between the wire and the Cu bond pad.

From the foregoing discussion, it is desirable to improve the performance of wire bond, such as SSB process for copper wire bonding and copper wire bonding through OSP surface.

SUMMARY

According to an aspect of the present invention, there is provided semiconductor package including a first substrate; a first semiconductor chip attached to the first substrate, wherein at least one of the first substrate and the first semiconductor chip has an OSP material coated on at least a portion of one surface; and a first copper wire that is wire bonded through the OSP material to the at least one of the first substrate and the first semiconductor chip.

The first substrate may include a lead finger, and the first copper wire may be wire bonded to the lead finger.

The lead finger may be coated with the OSP material.

The lead finger may include at least one of copper, aluminum, and silver.

The first semiconductor chip may include a bond pad, and the first copper wire may be wire bonded to the bond pad.

The bond pad may be coated with the OSP material.

The bond pad may include at least one of copper, aluminum, and silver.

The semiconductor package may further include a second semiconductor chip attached to the first substrate or to the first semiconductor chip, wherein at least one of the first substrate and the second semiconductor chip has the OSP material coated on at least a portion of one surface; and a second copper wire that is wire bonded through the OSP material to the at least one of the first substrate and the second semiconductor chip.

The first semiconductor chip and the second conductor chip may be disposed on opposite sides of the first substrate.

The semiconductor package may further include a second substrate having the OSP material coated on at least a portion of one surface; and a third copper wire that is wire bonded through the OSP material of the first substrate to a lead finger of the first substrate and through the OSP material of the second substrate to a lead finger of the second substrate, wherein the lead finger comprises at least one of copper, aluminum, and silver.

The second conductor chip may be stacked on the first semiconductor chip.

The semiconductor package may further include a second substrate having the OSP material coated on at least a portion of one surface; and a third copper wire that is wire bonded to the second semiconductor chip and is wire bonded through the OSP material of the second substrate to a lead finger of the second substrate, wherein the first semiconductor chip is disposed on the first substrate and on the second substrate, and wherein the lead finger includes at least one of copper, aluminum, and silver.

The semiconductor package may further include a third semiconductor chip, wherein at least one of the first substrate and the third semiconductor chip has the OSP material coated on at least a portion of one surface; and a third copper wire that is wire bonded through the OSP material to the first substrate and the third semiconductor chip, wherein the third semiconductor chip is stacked on the second semiconductor chip, and the second semiconductor chip is stacked on the first semiconductor chip.

With respect to a cross-section view of the semiconductor package, the third semiconductor chip may be wider than the second semiconductor chip, and the second semiconductor chip may be wider than the first semiconductor chip.

With respect to a cross-section view of the semiconductor package, the first semiconductor chip may be wider than the second semiconductor chip, and the second semiconductor chip may be wider than the third semiconductor chip.

The semiconductor package may further include one of a Ball Bond, Stitch Bond, Ribbon Bond, Wedge Bond, and Copper Stud Bond where the copper wire is wire bonded to the substrate.

The semiconductor package may further include one of a Ball Bond, Stitch Bond, Ribbon Bond, Wedge Bond, and Copper Stud Bond where the copper wire is wire bonded to the semiconductor chip.

According to an aspect, there is provided a method for constructing a semiconductor package, the method including: (a) wire bonding one end of a copper wire to a substrate through an OSP material that is coated on the substrate; and (b) wire bonding an opposite end of the copper wire to a semiconductor chip.

The substrate may include a lead finger; (a) may include wire bonding the copper wire through the OSP material to connect the lead finger to the semiconductor chip; and the lead finger may include at least one of copper, aluminum, and silver.

The lead finger may be coated with the OSP material.

The first semiconductor chip may include a bond pad; (b) may include wire bonding the copper wire to the bond pad; and the bond pad may include at least one of copper, aluminum, and silver.

The bond pad may be coated with the OSP material.

Furthermore, (a) may include forming one of a Ball Bond, Stitch Bond, Ribbon Bond, Wedge Bond, and Copper Stud Bond on the substrate.

Additionally, (b) may include forming one of a Ball Bond, Stitch Bond, Ribbon Bond, Wedge Bond, and Copper Stud Bond on the semiconductor chip.

According to another aspect, a method of forming a device comprises providing first and second contact regions of the device. A ball bump is formed on the first contact region. The ball bump is smoothened to form a flat top surface. A first of a wire is bonded to the second contact region while the second end of the wire is bonded to the top surface of the ball bump.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 7b illustrates copper wires which are wire bonded to lead fingers of the substrate of the semiconductor package of FIG. 7a;

FIGS. 10a and 10b show alternate views of a copper Stud Bump and Stitch On Stud Bump on OSP coated lead fingers of an OSP substrate;

FIGS. 11a and 11b show alternate views of a copper Stitch Bond on OSP coated lead fingers of an OSP substrate;

FIGS. 12a and 12b show alternate views of a copper Stud Bump and Stitch On Stud Bump on OSP coated pads of a semiconductor chip;

FIGS. 13a and 13b show alternate views of a copper Ball Bond on OSP coated lead fingers of an OSP substrate;

FIGS. 14a and 14b show alternate views of a copper Ball Bond on OSP coated pads of a semiconductor chip;

FIGS. 15a and 15b show a copper Single Stud and Stack Stud Bump on the OSP coated bond pads of a semiconductor chip;

FIGS. 18a-d show an embodiment of a process for bonding first and second contact regions;

FIG. 22b shows ball shear comparison data for stand off stitch bonds formed on aluminum contact regions with forming gas and without forming gas purge;

FIG. 23 shows ball shear and stitch pull comparison data for stand off stitch bonds formed on OSP coated contact regions; and FIG. 24 shows results of various types of reliability tests performed on test samples.

DETAILED DESCRIPTION

Embodiments generally relate to semiconductor packages. For example, the packages have contact regions which are bonded by wire bonding. In some embodiments, at least one of the contact regions comprises copper and is coated with an Organic Solderability Preservative (OSP) material. The contact regions can be bonded with a copper wire. Such semiconductor packages are widely used in electronic devices. For example, the electronic devices can be memory devices, wireless communication devices, or automobile controlling devices. The devices are incorporated into consumer products, such as consumer electronic products. Incorporated the devices in other types of products is also useful.

Figure 1:
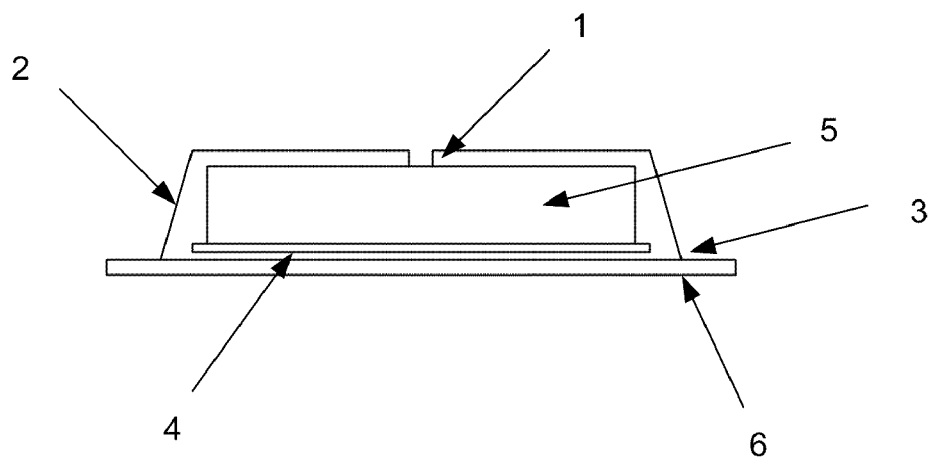
FIG. 1 illustrates a semiconductor package according to an exemplary embodiment of the present invention.

FIG. 1 illustrates a semiconductor package according to an exemplary embodiment of the present invention.

As shown in FIG. 1 the semiconductor package according to an exemplary embodiment includes bond pads 1, copper wires 2, lead fingers 3, adhesive material 4, a semiconductor chip 5, and an OSP substrate 6.

The adhesive material 4 is used to provide adhesion between the semiconductor chip 5 and the OSP substrate 6.

The OSP substrate 6 is coated in an OSP material, and the copper wire 2 is wire bonded through the OSP material to a lead finger 3 of the OSP substrate 6. The substrate may be a lead frame material (e.g., Alloy 42, Cu7025, Olin 0194, and other copper alloys), PCB, substrate core material (e.g., BT832, Hitachi E679, Nanya NPG-150), glass panel or ceramic material. The OSP coating on the substrate 6 may be over the entire surface, partially over the surface or on the lead fingers 3. The lead finger 3 or bond pad 1 may comprise copper, aluminum, silver, or other conductive materials. The copper wire 2 is also wire bonded to the bond pad 1 of the semiconductor chip 5, and the bond pad 1 may be coated in the OSP material.

Figure 2:
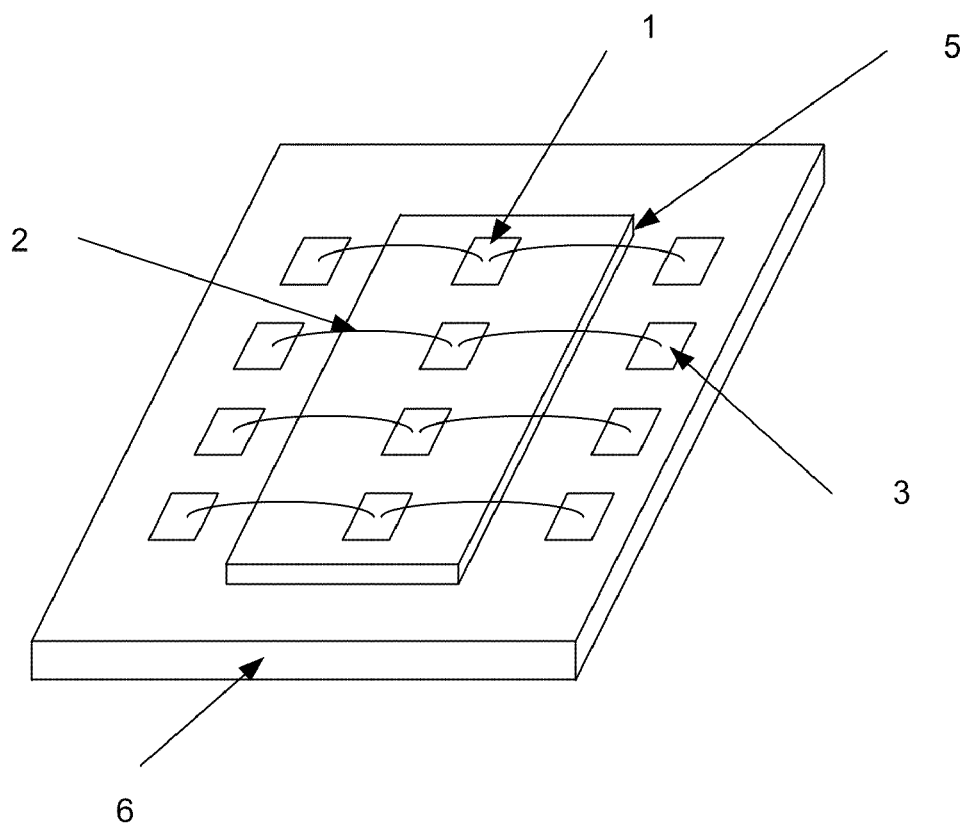
FIG. 2 is an isometric view of the semiconductor package of FIG. 1.

FIG. 2 is an isometric view of the semiconductor package of FIG. 1. As shown in FIG. 2, the copper wire bonding is able to provide an electrical connection for the semiconductor chip 5 with bond pads 1 located at the center or peripheral of the die. The length of copper wires 2 can be varied accordingly with respect to the location of the bond fingers 3 on the OSP substrate 6.

Figure 3:
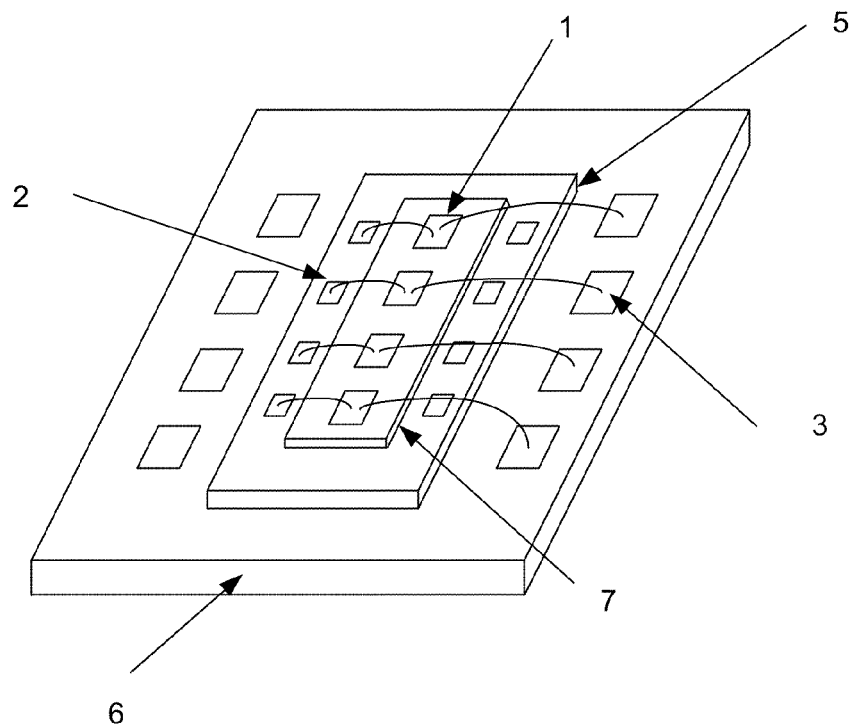
FIG. 3 is an isometric view of a semiconductor package according to another exemplary embodiment of the present invention.

FIG. 3 is an isometric view of a semiconductor package according to another exemplary embodiment. As shown in FIG. 3, the semiconductor package may include a second semiconductor chip 7 stacked vertically with semiconductor chip 5. The second semiconductor chip 7 has a plurality of bond pads 1. Copper wire bonding provides an electrical connection between the bond pads 1 of the second semiconductor chip 7 and the bond pads 1 of the semiconductor chip 5. Copper wire bonding also provides an electrical connection between the bond pads 1 of the second semiconductor chip 7 and the lead fingers 3 of the OSP substrate 6. The bond pads 1 of the semiconductor chip 5 and/or the second semiconductor chip 7 may be coated in the OSP material.

Figure 4:
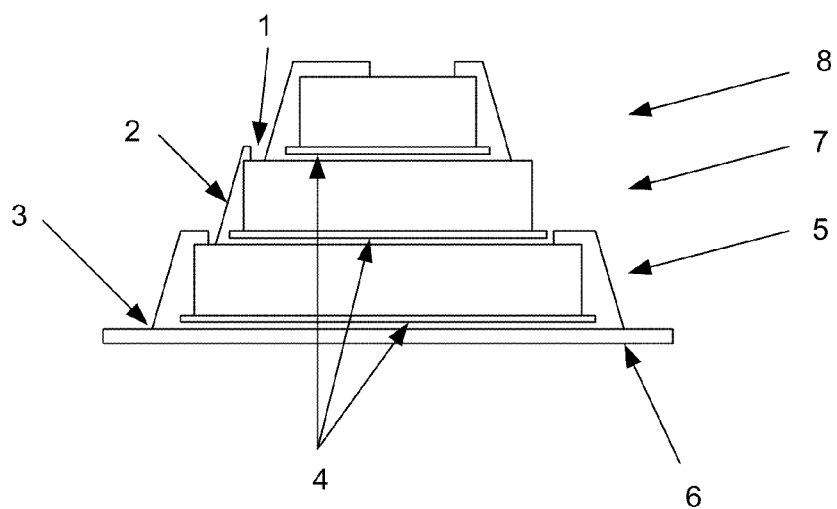
FIG. 4 illustrates a semiconductor package according to another exemplary embodiment of the present invention.

FIG. 4 illustrates a semiconductor package according to another exemplary embodiment. As shown in FIG. 4, the semiconductor package may include a third semiconductor chip 8 stacked vertically with the second semiconductor chip 7 and the first semiconductor chip 5. Similar to the semiconductor chip 5 and the second semiconductor chip 7, the third semiconductor chip 8 has a plurality of bond pads 1. Copper wire bonding provides an electrical connection between the bond pads 1 of the third semiconductor chip 8 and the bond pads 1 of each of the semiconductor chip 5 and the second semiconductor chip 7. Copper wire bonding also provides an electrical connection between the bond pads 1 of the third semiconductor chip 8 and the lead fingers 3 of the OSP substrate 6. The bond pads 1 of the semiconductor chip 5, the second semiconductor chip 7 and/or the third semiconductor chip 8 may be coated in the OSP material.

Figure 5:
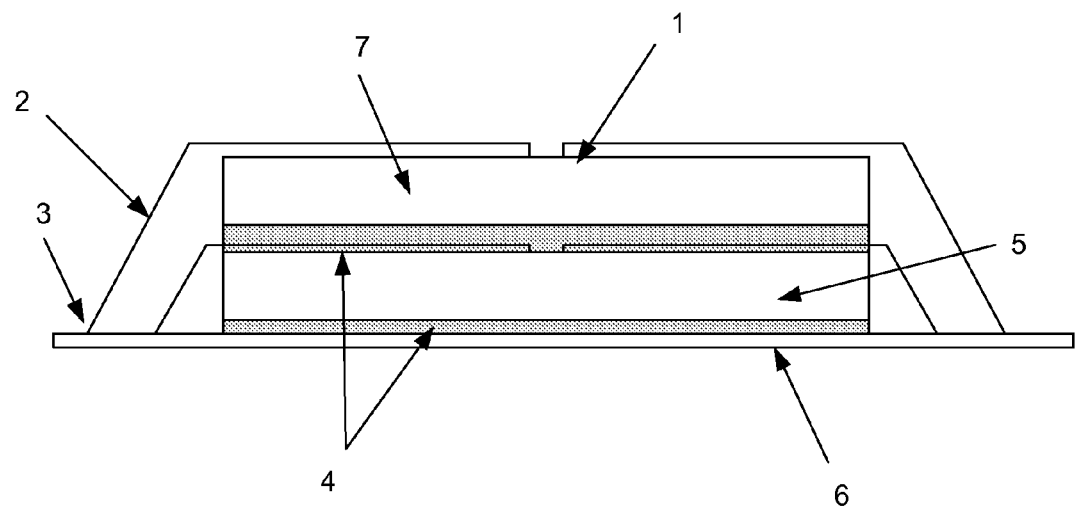
FIG. 5 illustrates a semiconductor package according to another exemplary embodiment of the present invention.

FIG. 5 illustrates a semiconductor package according to another exemplary embodiment. As shown in FIG. 5, the second semiconductor chip 7 may be stacked vertically on the semiconductor chip 5. Also, the second semiconductor chip 7 and the semiconductor chip 5 may have approximately the same width with respect to a cross section view of the semiconductor package. The bond pads 1 of the semiconductor chip 5 and/or the second semiconductor chip 7 may be coated in the OSP material.

Figure 6:
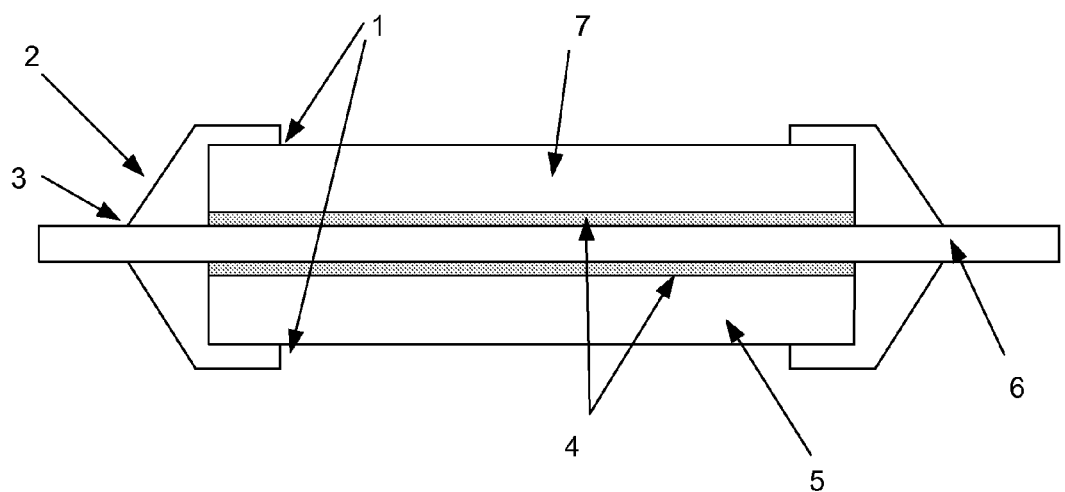
FIG. 6 illustrates a semiconductor package according to another exemplary embodiment of the present invention.

FIG. 6 illustrates a semiconductor package according to another exemplary embodiment. As shown in FIG. 6, the second semiconductor chip 7 and the semiconductor chip 5 may be disposed on opposite sides of the OSP substrate 6. The bond pads 1 of the semiconductor chip 5 and/or the second semiconductor chip 7 may be coated in the OSP material.

Figure 7A:
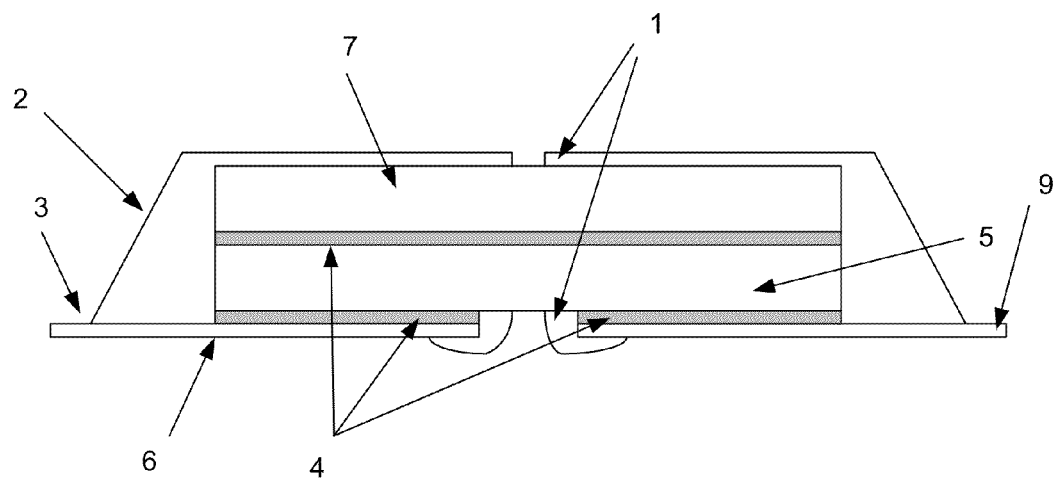
FIG. 7a illustrates a semiconductor package according to another exemplary embodiment of the present invention.

FIG. 7a illustrates a semiconductor package according to another exemplary embodiment. As shown in FIG. 7a, the semiconductor package may include a second OSP substrate 9 which is coated in the OSP material. The OSP coating on the second substrate 9 may be over the entire surface, partially over the surface or on lead fingers 3. The semiconductor chip 5 is arranged so that a bottom surface thereof is disposed on both the OSP substrate 6 and the second OSP substrate 9.

Figure 7B:
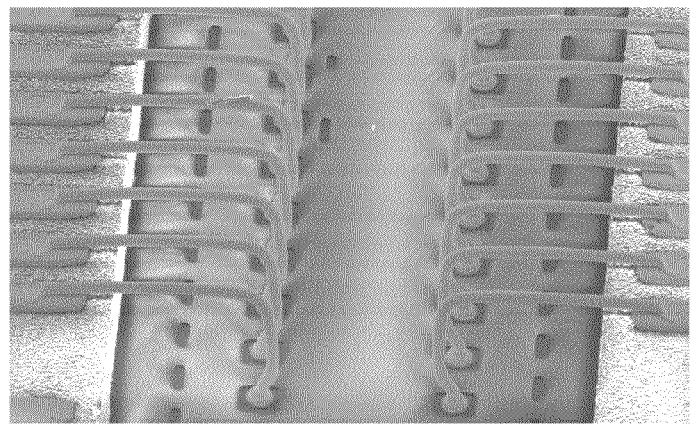

Thus, a portion of the bottom surface of the semiconductor chip 5 is exposed. This exposed portion includes a plurality of bond pads 1 which are wire bonded to lead fingers 3 of the OSP substrate 6 and the second OSP substrate 9, as shown in FIG. 7b. The second semiconductor chip 7 is arranged on the semiconductor chip 5. The bond pads 1 of the semiconductor chip 5 and/or the second semiconductor chip 7 may be coated in the OSP material. The first OSP substrate 6 and second OSP substrate 9 may be an integral structure separated by an aperture which exposes the portion of the bottom surface of the semiconductor chip 5.

Figure 8:
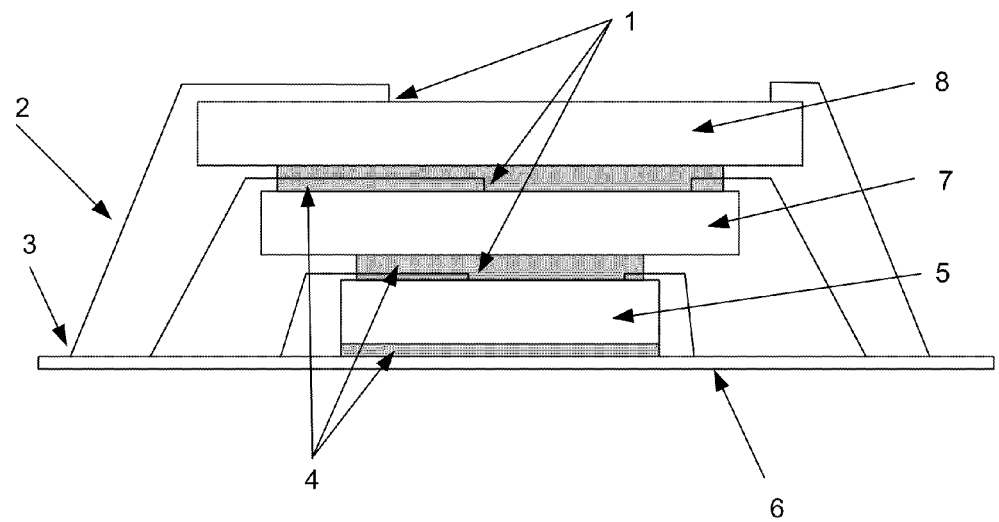
FIG. 8 illustrates a semiconductor package according to another exemplary embodiment of the present invention.

FIG. 8 illustrates a semiconductor package according to another exemplary embodiment. As shown in FIG. 8, the semiconductor chip 5, the second semiconductor chip 7, and the third semiconductor chip 8 may be stacked vertically with descending widths approaching the OSP substrate 6. The bond pads 1 of the semiconductor chip 5, the second semiconductor chip 7 and/or the third semiconductor chip 8 may be coated in the OSP material.

Figure 9:
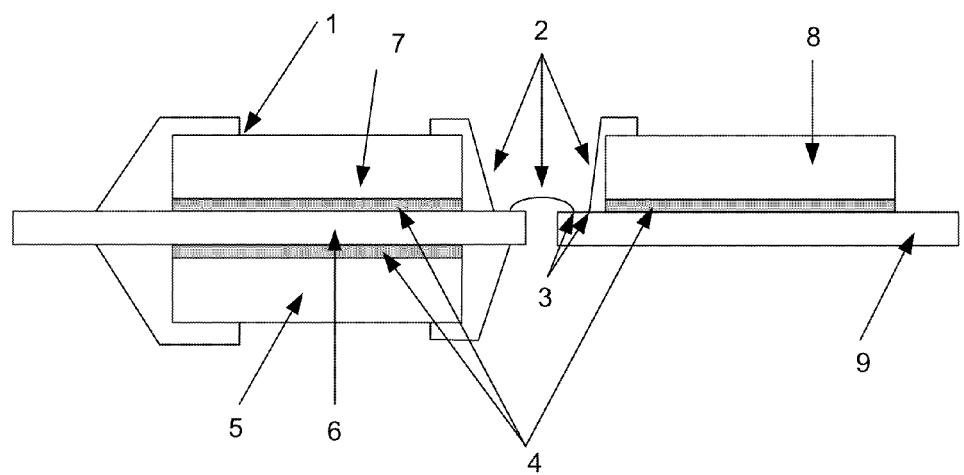
FIG. 9 illustrates a semiconductor package according to another exemplary embodiment of the present invention.

FIG. 9 illustrates a semiconductor package according to another exemplary embodiment. As shown in FIG. 9, the semiconductor chip 5 and the second semiconductor chip 7 are disposed on opposite sides of the OSP substrate 6. Also, the third semiconductor chip 8 may be disposed on the second OSP substrate 9. Copper wire bonding may electrically connect lead fingers 3 of the OSP substrate 6 and the second OSP substrate 9. The bond pads 1 of the semiconductor chip 5, the second semiconductor chip 7 and/or the third semiconductor chip 8 may be coated in the OSP material.

FIGS. 10-16 illustrate various bonding combinations for copper wire through OSP coating.

FIGS. 10a and 10b show alternate views of a copper Stud Bump and Stitch On Stud Bump on OSP coated lead fingers of an OSP substrate.

FIGS. 11a and 11b show alternate views of a copper Stitch Bond on OSP coated lead fingers of an OSP substrate.

FIGS. 12a and 12b show alternate views of a copper Stud Bump and Stitch On Stud Bump on an OSP coated bond pads of a semiconductor chip.

FIGS. 13a and 13b show alternate views of a copper Ball Bond on OSP coated lead fingers of an OSP substrate.

FIGS. 14a and 14b show alternate views of a copper Ball Bond on OSP coated bond pads of a semiconductor chip.

FIGS. 15a and 15b show a copper Single Stud and Stack Stud Bump on the OSP coated bond pads of a semiconductor chip.

Figure 16A:
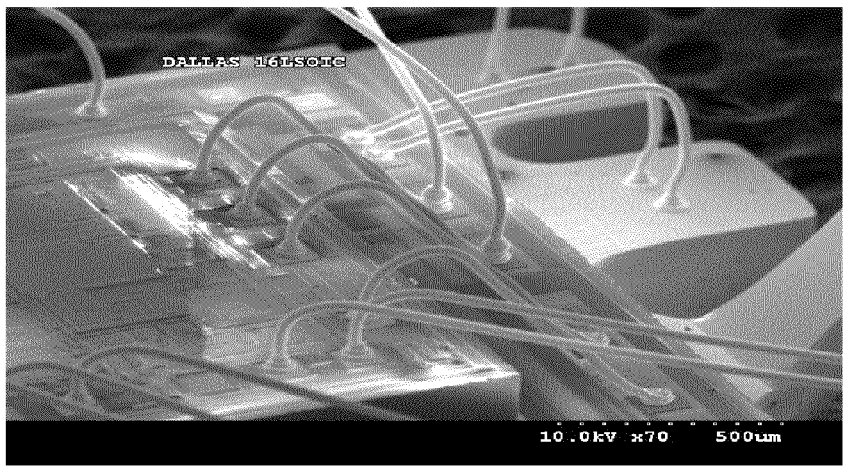
FIGS. 16 and 16b show a copper Ball Bond on OSP coated bond pads as well as on OSP coated lead fingers.
Figure 16B:
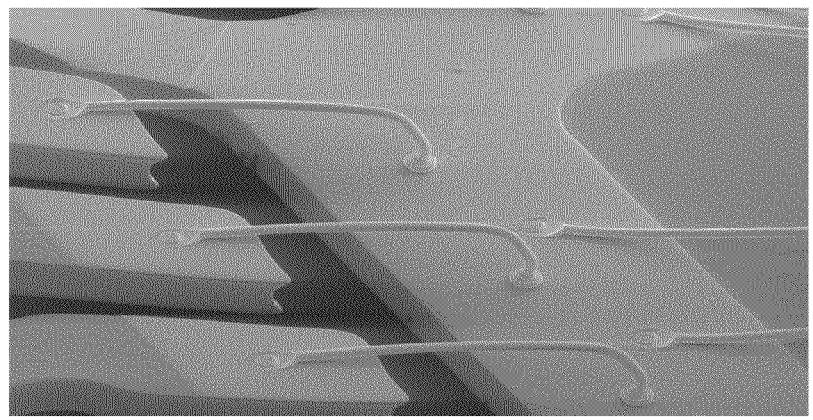

FIGS. 16a and 16b show a copper Ball Bond on OSP coated bond pads as well as on OSP coated lead fingers.

Figure 17:
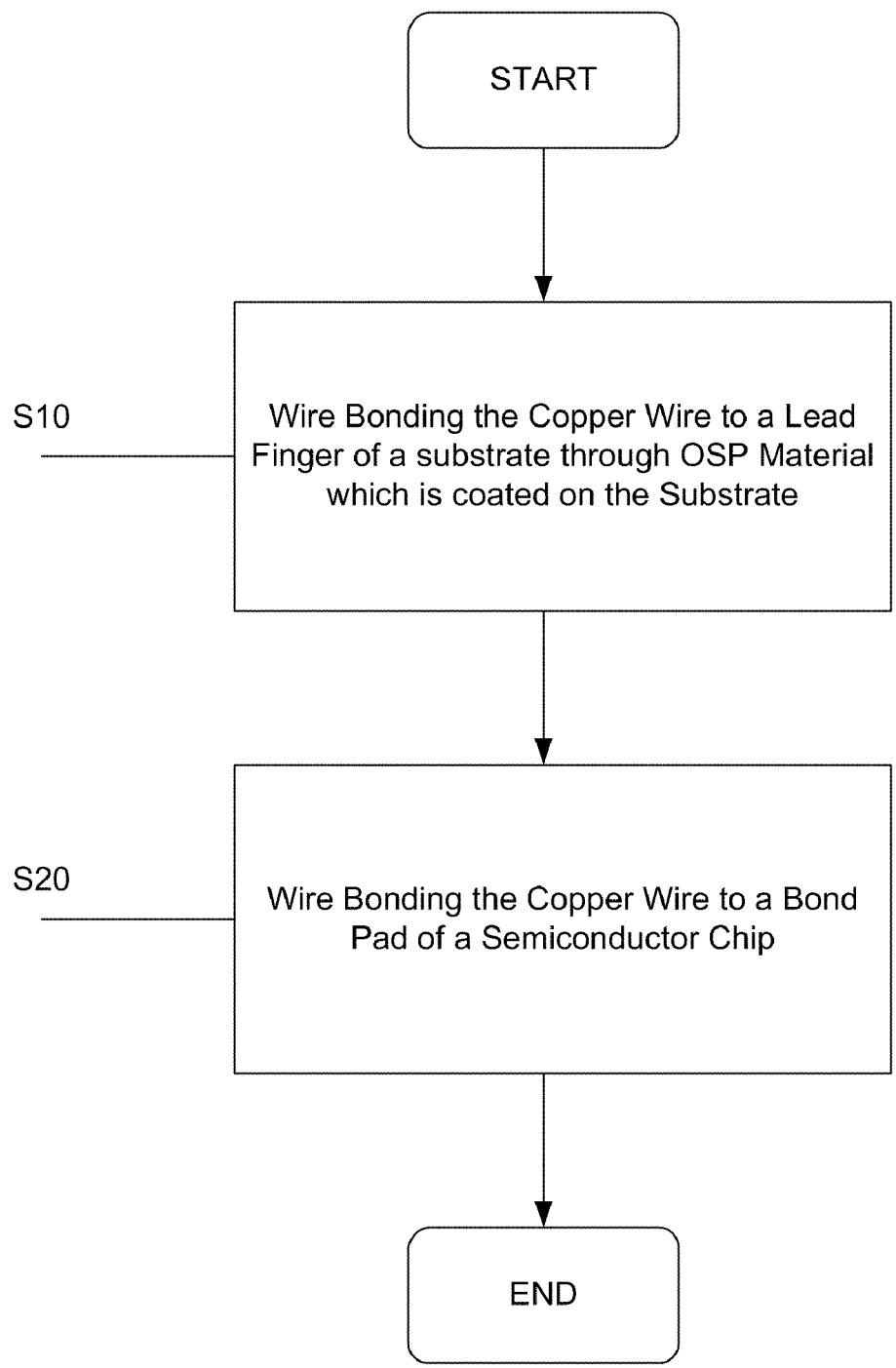
FIG. 17 shows a method of constructing a semiconductor package according to an exemplary embodiment of the present invention.

FIG. 17 shows a method of constructing a semiconductor package according to an exemplary embodiment. In operation S10, a copper wire 2 is wire bonded to the lead finger 3 of the OSP substrate 6 through the OSP material which is coated on the OSP substrate 6. In operation S20, the copper wire 2 is wire bonded to the bond pad 1 of the semiconductor chip 5.

Referring back to FIGS. 1 to 9, some embodiments of the invention disclose applying the Stand off Stitch on ball Bonding (SSB) process for copper wire bonding, for example, between a semiconductor chip and a substrate of a semiconductor package. This SSB process for copper wire bonding can also be applied in other semiconductor packages, as previously introduced, such as packages including a second semiconductor chip, a third semiconductor chip or more semiconductor chips, wherein copper wires are wire bonded to the substrate and semiconductor chips.

FIGS. 18a-d show an embodiment of a process 300 for wire bonding a device 330, such as a die to a carrier or substrate of a package. The die, for example, is attached to the substrate.

Various techniques, such as tape or an adhesive can be employed to attach the die to the substrate. As shown, first and second contact regions 340 and 360 are provided.

One of the regions is provided on the package substrate while the other region is provided on the die. In one embodiment, the first contact region 340 is disposed on the substrate 332 and the second contact region 360 is disposed on the die 334. The first contact region, for example, is a substrate lead finger while the second contact region is a die bond pad. Other types of contact regions are also useful. Alternatively, the first contact region is disposed on the die and the second contact region is disposed on the substrate. As shown, the first contact region is disposed below the second contact region. This may be due to the fact that the die is attached to the substrate. Other arrangements, such as having the contact region on the substrate disposed below the contact region on the die or having the contact regions being coplanar, are also useful.

The contact regions are coupled by a wire bond. In one embodiment, the contact regions comprise copper. In one embodiment, at least one of the contact regions comprises copper coated with OSP. For example, the contact region on the substrate comprises copper coated with OSP while the second contact region on the die comprises aluminum without OSP coating. Providing both contact regions comprising copper coated with OSP may also be useful. In one embodiment, the contact regions are coupled by a copper wire bond. Other configurations or combination of contact region materials, coatings and conductive wires may also be useful.

Wire bonding is performed by a wire bonding tool. The wire bonding tool includes a capillary 370 through which a conductive wire 325 is threaded. Preferably, the wire comprises copper. Other types of conductive wires are also useful. A clamp (not shown) positions or moves the wire. To facilitate bonding, the capillary can be translated along the x-y axis along the plane of the device as well as the z-axis perpendicular to the plane of the device. Providing a stage which translates the device in the x-y-z direction or a combination of translatable capillary and device is also useful.

Referring to FIG. 18a, a conductive ball 326a is formed at the tip of the conductive wire at step 302. In one embodiment, a copper ball is formed at the tip of the copper wire. The conductive ball, for example, can be formed by an electric flame off (EFO) unit. Forming gas is provided to the EFO unit during formation of the copper ball on the tip of the copper wire. The forming gas, in one embodiment, comprises about 95% nitrogen and 5% hydrogen. Other techniques for forming the conductive ball are also useful.

The capillary positions the conductive wire with the conductive ball on the first contact region at step 304 to form a ball bump thereon. The capillary forms a ball bump of the desired dimensions. The desired dimensions of the ball bump may depend, for example, on the size and pitch of the contact regions and the thickness of the conductive wire. The desired dimensions may be achieved with the appropriate capillary design, as will later be described. In one embodiment, the capillary forms the ball bump by applying bond pressure (BP) and ultrasonic energy (USG) for a processing time (T) to form a ball bump 326b on the first contact region at step 304. The process parameters should form a ball bump is which sufficiently bonded to the copper contact region. In one embodiment, the process parameters should form a ball bump which penetrates the OSP coating of the copper contact region as well as being sufficiently bonded to the copper. These parameters may depend, for example, on the dimensions and configuration of the die bond pad and substrate lead fingers, and can be tailored for desired applications.

As shown in FIG. 18b, the capillary is relocated away from the first contact region at step 306. This causes the wire to separate from the ball bump, leaving the ball bump remaining on the first contact region. In one embodiment, the ball bump is formed with a flat or planar surface. The flat surface, in one embodiment, is devoid of a tail. In one embodiment, the ball bump is formed with a flat surface which is about coplanar with the plane of the first contact region. In other embodiments, the flat surface is formed at an angle to the plane of the first contact region. The planar surface increases surface bonding area which has been found to improve the pull strength of the wire bonded thereto.

In FIG. 18c, after the capillary has been separated from the ball bump, another conductive ball 327a is formed at the tip of the wire at step 308. The capillary positions the conductive ball, at step 310, on the second contact region to form a ball bond 327b.

Figure 18D:
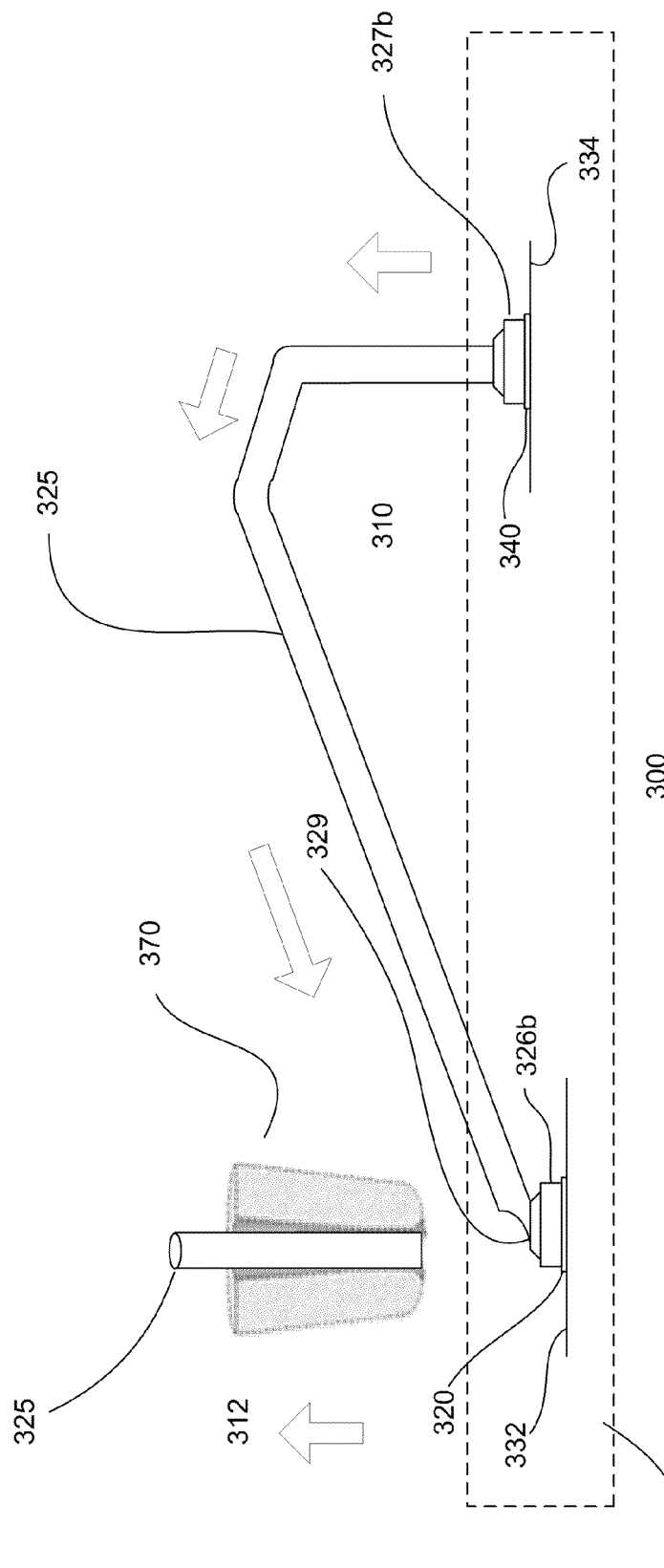

The capillary is repositioned at step 310 to the first contact region without separating the wire from the ball bond at the second contact region, as shown in FIG. 18d. In one embodiment, the path of the capillary from the second contact region to the first contact region forms a loop in the wire. This process, for example, can be referred to as "looping". The path of the capillary is selected to produce the desired loop shape and height. At the first contact region, the capillary forms a stitch bond on the ball bump 327a. After the stitch bond is formed, the capillary separates the copper wire from the stitch bond, completing the wire bond between the first and second contact regions.

In a device, there are generally a plurality of first and second contact regions which are coupled by wire bonding. The process, as described, repeats until all first and second contact regions are coupled.

Figure 19:
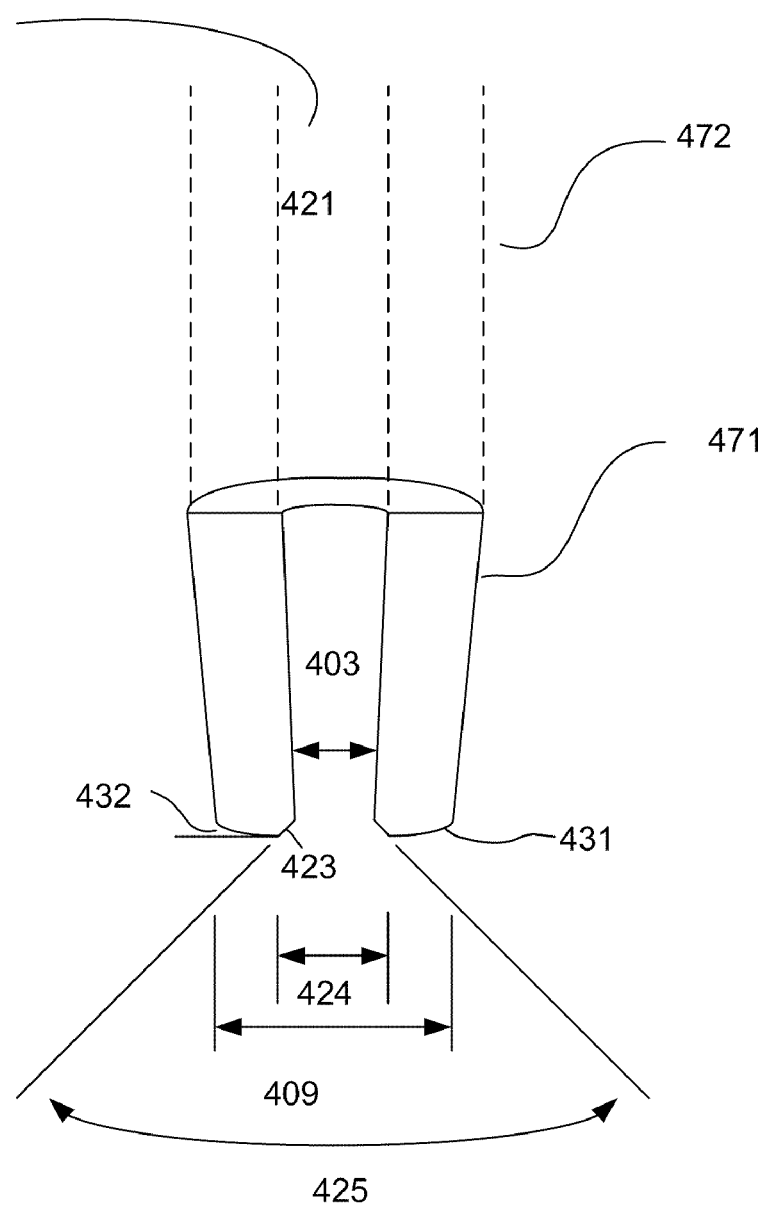
FIG. 19 shows an embodiment of a capillary for bonding.

The shape and dimensions of the ball bump depend on, at least partially, the capillary design. FIG. 19 shows an embodiment of a tip 471 of a capillary 370. The capillary, for example, can be formed from a ceramic material. Other type of materials for forming the capillary which can sustain the EFO process is also useful. A body 471 of the capillary may be straight (indicated by the dotted line) with the tip tapering at an angle. The center of the capillary comprises a hole 421 through which a conductive wire is threaded. The hole may be narrowed at least at the tip, for example, to facilitate guiding the conductive therethrough. Other configurations of the hole may also be useful. The hole should be sufficient to accommodate a conductive wire. In one embodiment, the hole accommodates a conductive wire, such as a copper wire of about 0.8 mm in diameter. Accommodating other sized conductive wires is also useful.

At the bottom of the tip, the hole is chamfered. Chamfering the bottom of the hole creates an internal angled surface 423. The bottom of the angle surface corresponds to a chamfer diameter 424 while the angle of the surface corresponds to a cone angle 425 of the capillary. The chamfer diameter and cone angle are internal dimensions of the capillary which are designed to produce a ball bump or ball bond with the desired shape.

The external dimensions of the capillary, on the other hand, influence the shape of the stitch bond. For example, an outer radius of the tip 431, face angle 432 and tip diameter 409 are selected to produce the desired stitch shape.

Figures 20A, 20B, 20C:
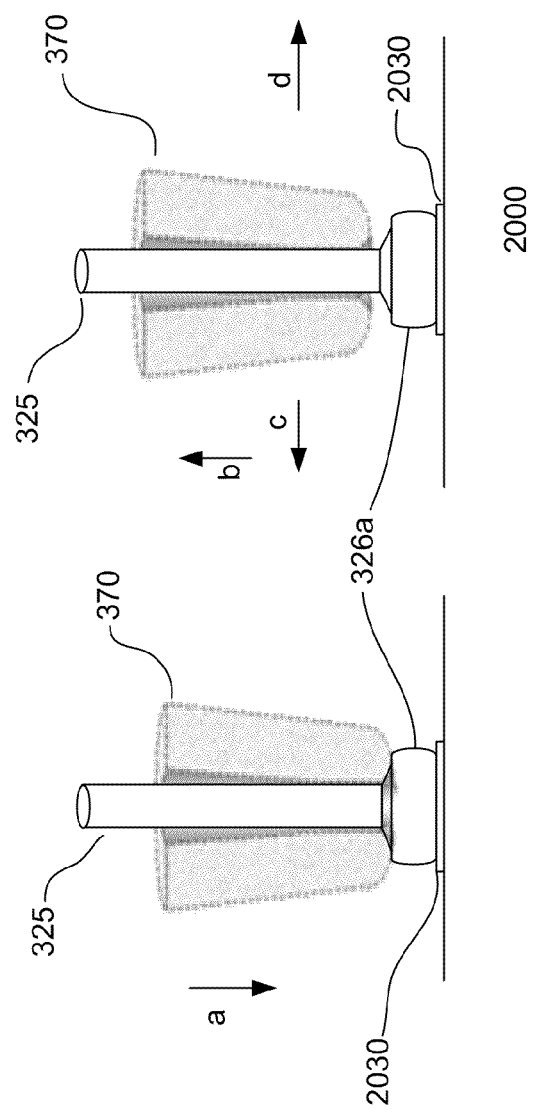
FIGS. 20a-c illustrate an embodiment of a bump formation process.

FIG. 20a-c show a process 2000 for smoothing the ball bump 326b to form a flat top or landing surface 327 on the ball bump. The process as depicted by FIG. 20a-c occurs after Step 304 of FIG. 18a. Referring to FIG. 20a, a capillary 370 is lowered onto a contact region 2030. In a preferred embodiment, the capillary is lowered in a direction a, which is perpendicular to the contact region. Lowering of the capillary depresses the conductive ball at the tip of the conductive wire 325. The process of depressing the conductive ball deforms the conductive ball to form a desired shaped ball bump 326a coupled to the conductive wire.

In FIG. 20b, after forming the ball bump having the desired shape, the capillary is raised. In one embodiment, the capillary is raised along a direction b which is perpendicular to the plane of the contact region. The capillary, in one embodiment, is raised so that a bottom of the capillary is aligned about to the landing surface of the ball bump. In the case where the landing surface is angled, the capillary is raised to a position equal to about the highest point of the landing surface.

After the capillary is raised to the desired position, it is translated across the ball bump to separate the conductive wire from the ball bump. In one embodiment, the capillary is translated in first and second directions away from one side of the ball bump. In one embodiment, the first and second directions are opposing directions across the ball bump, as indicated by arrows c and d. In one embodiment, the direction of translation from c to d is across or along the landing surface of the contact region. For example, the capillary is translated first in the c direction and reverses across the landing surface of the contact region in the d direction. In one embodiment, the capillary is translated once each in the first direction and in the opposite or second direction across the landing surface of the contact region. Translating the capillary more than once in one or both directions is also useful. In other embodiments, the capillary may be translated in different or non-opposite directions. The translation process separates the ball bump 326b from the conductive wire and forms a planar surface 327, as shown in FIG. 20c. For applications where the flat surface is angled, the capillary is translated along the same angle as the flat surface.

Figure 21:
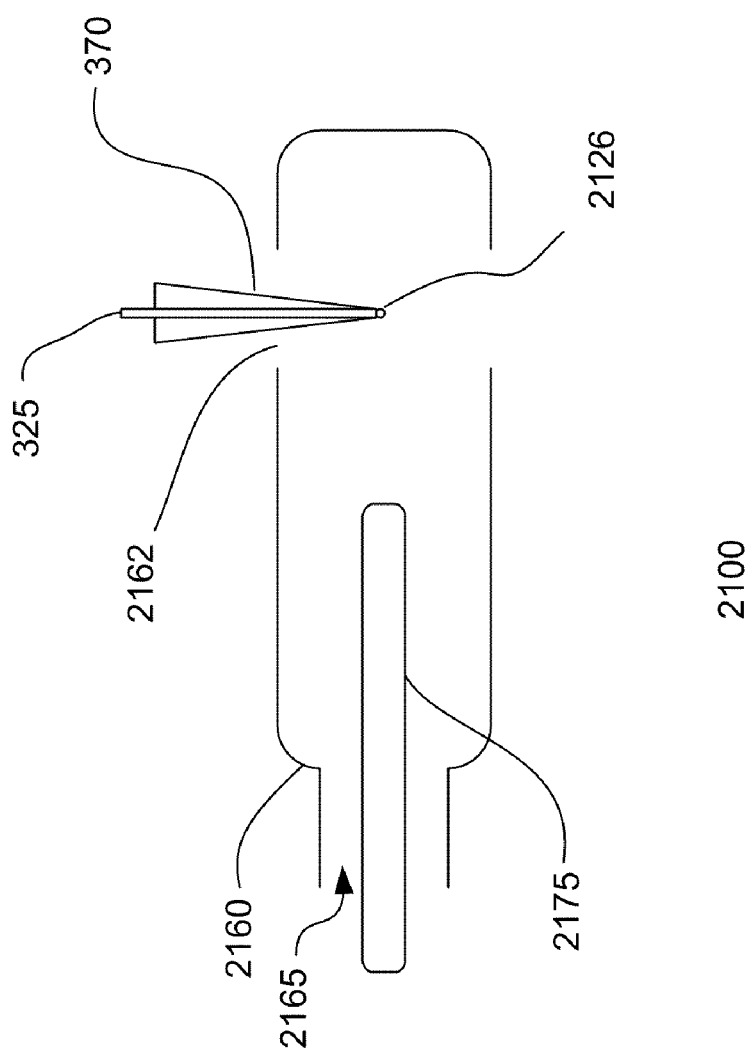
FIG. 21 shows an embodiment of an EFO sub-system.

FIG. 21 shows an embodiment of an EFO unit 2100. The EFO unit comprises a forming chamber 2160 having an opening 2162 to enable positioning of a capillary therein as well as passing therethrough. The forming chamber includes forming gas inlet 2165 and an EFO source 2175.

In operation, a forming gas is injected into the forming chamber. The forming gas, in one embodiment, comprises a reducing ambient which serves to prevent oxidation of the conductive ball that will be formed at the tip of the capillary in the forming chamber. In one embodiment, the forming gas comprises hydrogen and nitrogen. In one embodiment, the forming gas comprises about 5% hydrogen and about 95% nitrogen. Providing a forming gas with other percentages of hydrogen and nitrogen or other compositions of components is also useful.

The capillary is positioned in the forming chamber, with the conductive wire is extended beyond the tip. Once in position, the EFO source discharges a spark at the end of the conductive wire extending beyond the capillary. The spark melts the exposed portion of the conductive wire to form a conductive ball at the tip of the capillary. Once the conductive ball is formed, the capillary, for example, passes through the forming chamber and is positioned on the contact region to form the ball bump.

In accordance with one embodiment, the EFO unit does not include a forming gas dispensing unit. That is, the conductive ball is formed and bonded to the contact region without a forming gas dispensing unit. In conventional bonding processes, bonding the conductive ball on the contact region requires a forming gas dispensing unit. A forming gas dispensing unit, for example, comprises a near vertical tube (NVT) which is disposed near the contact region to provide forming gas over the formed conductive ball bump to prevent oxidation. Oxidation can reduce bond performance and reliability. For example, oxidation of the ball bump may affect the bonding strength of the stitch bond to the ball bump in a SSB process. However, in accordance with one embodiment, good bond performance and reliability can be achieved without the need of the forming gas dispensing unit. Avoiding the need to have a forming gas dispensing unit can result in savings in usage of forming gas and hence the costs associated therewith.

Experiment 1

An experiment was conducted on test samples having first and second contact regions coupled by wire bonds. The first contact region is a substrate lead finger comprising aluminum. The second contact region is a die bond pad comprising aluminum. An ICU copper wire is used for the wire bonding process. The ICU copper wire is a 0.8 mm ICU copper wire from Kulicke & Soffa. An end of copper wire is coupled to the second contact region with a ball bond while the other end is coupled to the first contact region with a stitch bond on ball bump (e.g., stand off stitch bond). Wire bonding was performed using a Maxum Ultra wire bonder with a Copper Kit and CU-FC-1049-P37 Cupra+capillary from Kulicke & Soffa. The wire bond process employed on the test samples is similar to that described in FIGS. 18a-d.

The ball bump on the first contact region is formed with a flat surface. To form the ball with a flat surface, the capillary is moved over the ball bump. The smoothing action involves moving the capillary across the ball bump toward direction c and then direction d, as shown and described for FIG. 20b. In a first set of test samples, forming gas is supplied to the ball bump using a NVT. The NVT dispenses the forming gas on the ball bump. The forming gas comprises 95% $N_2$ and 5% $H_2$. In a second set of test samples, no forming gas is supplied to the ball bump by the NVT.

Stitch pull and bond shear tests were performed on ball bonds and stand-off stitch bonds formed on the contact regions of the first and second sets of test samples. The testing is performed using a Dage 4000 bond tester from Dage Holdings Limited.

Figure 22A:
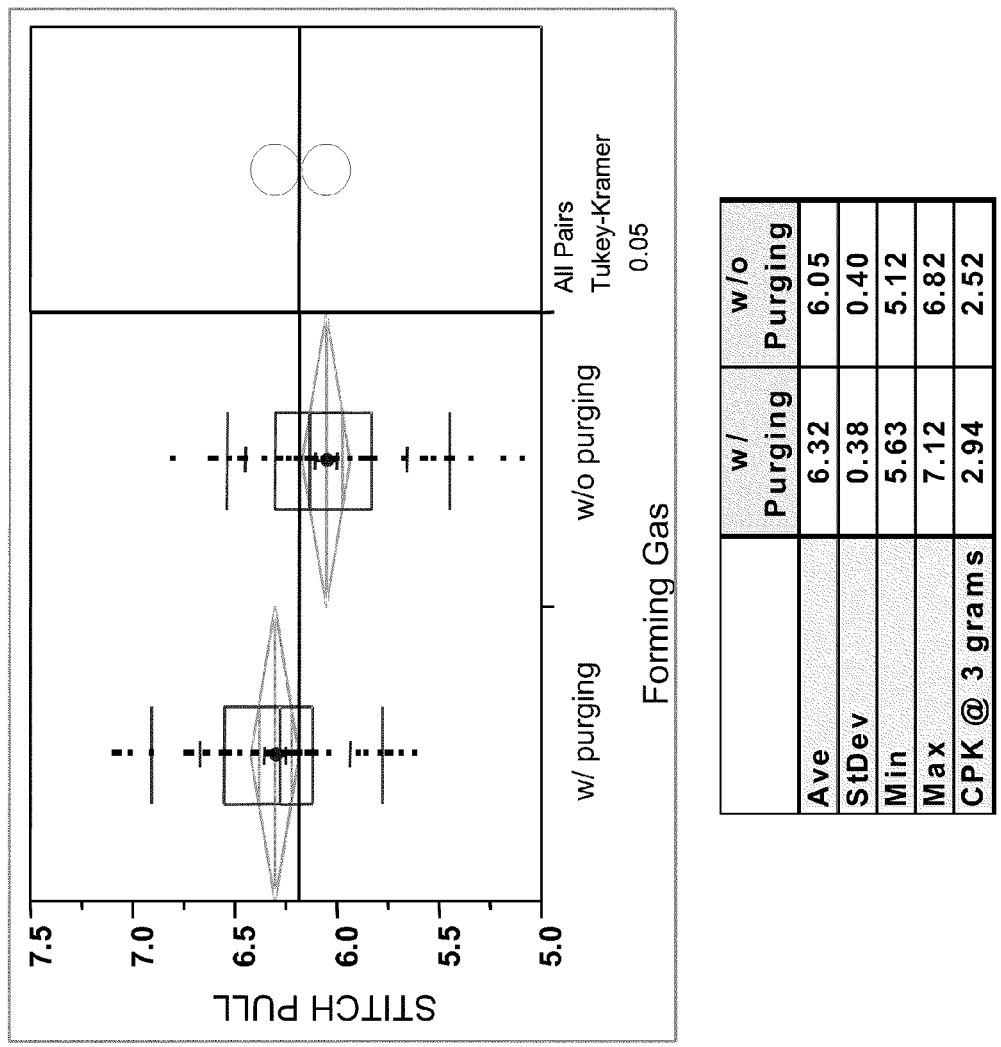
FIG. 22a shows bump pull comparison data for stand off stitch bonds formed on aluminum contact regions with forming gas and without forming gas purge.

FIG. 22a shows the bump pull strengths of the stand-off stitch bonds with forming gas and without forming gas. As can be seen from FIG. 22a, the average pull strength of the stand-off stitch bonds with the forming gas ranges from 5.63 to 7.12 gram force with an average of 6.32 gram force and CPK of 2.94. The average pull strength of the stand-off stitch bonds without the forming gas ranges from 5.12 to 6.82 gram force with an average of 6.82 gram force and CPK of 2.52. Hence, it can be concluded that the forming gas over the ball bump does not significantly improve the bond strength of the stand off stitch bond at the first contact region.

FIG. 22b shows the ball shear strengths of the stand-off stitch bonds with forming gas and without forming gas. As can be seen from FIG. 22b, the average ball shear strength of the stand-off stitch bonds with the forming gas ranges from 24.86 to 27.79 gram force with an average of 26.26 gram force. The average pull strength of the stand-off stitch bonds without the forming gas ranges from 23.97 to 27.87 gram force with an average of 25.55 gram force. Hence, as is consistent with the results of the bump pull test, the forming gas over the ball bump does not significantly improve the bond shear strength of the ball bump and the stand-off stitch bond at the first contact region.

Embodiments of the invention also relate to coupling a first contact region to a second contact region using copper wire, where the first and/or second contact region is coated with an OSP material. The process of coupling the two contact regions using the copper wire is similar to that as shown and described above for FIGS. 18a-d. One of the regions is provided on the package substrate while the other region is provided on the die. As shown, the first contact region 340 is disposed on the substrate 332 and the second contact region 360 is disposed on the die 334. The first contact region may be a copper lead finger coated with OSP (not shown) while the second contact region may be an aluminum die bond pad. Other types of contact regions such as aluminum, silver or other conductive materials, with or without the OSP, are also useful. The substrate may have OSP coated on the second contact region or on the entire substrate surface including the second contact region.

Referring to FIG. 18a, a conductive ball 326a is formed at the tip of the conductive wire at step 302. In one embodiment, a copper ball is formed at the tip of the copper wire. The conductive ball, for example, can be formed by an electric flame off (EFO) unit. The capillary positions the conductive wire with the conductive ball on the OSP coated first contact region at step 304 to form a copper ball bump thereon. The copper ball bump is formed through the OSP layer and onto the first contact region. Before proceeding to the steps shown in FIG. 18(b), the capillary, after forming the copper ball bump, moves along directions c and d as shown and described for FIG. 20a to 20c to create a flat surface on the copper ball bump.

As shown in FIG. 18b, the capillary is relocated away from the first contact region at step 306. This causes the wire to separate from the copper ball bump, leaving it remaining on the first contact region. The flat surface of the copper ball bump may be horizontal or at an angle to the horizontal.

In FIG. 18c, after the capillary has been separated from the copper ball bump, another conductive ball 327a is formed at the tip of the wire at step 308. The capillary positions the conductive ball, at step 310, on the second contact region to form a ball bond 327b.

The capillary is repositioned at step 310 to the first contact region without separating the wire from the ball bond at the second contact region, as shown in FIG. 18d. At the first contact region, the capillary forms a stitch bond on the ball bump 327a. After the stitch bond is formed, the capillary separates the copper wire from the stitch bond, completing the wire bond between the first and second contact regions.

Experiment 2

Another experiment was conducted on two test samples Unit 1 and Unit 2. The test samples comprise Fine-Pitch Ball Grid Array (FBGA) with die size 10×0.5 mm semiconductor packages. The first contact region is a copper lead finger provided on the substrate and is coated with OSP. The second contact region is an aluminum bond pad provided on the die without OSP coating. A copper wire is used for the wire bonding process. The copper wire is a 24.um AFW-ICU copper wire from Kulicke & Soffa. Wire bonding was performed using a Maxum Ultra wire bonder with a Copper Kit and CU-FB-1031-P37 capillary from Kulicke & Soffa.

The capillary guides the copper wire into a forming chamber filled with forming gas where an EFO electrode sparks an exposed portion of the copper wire at the tip of the capillary to form a copper ball. The forming gas comprises 95% $N_2$ and 5% $H_2$. The capillary then exits the forming chamber and the copper ball is lowered to contact the OSP coated first contact region to form a ball bump. Upon forming the ball bump, the capillary is moved over the ball bump to create a flat surface. The smoothing action involves moving the capillary toward direction c and then direction d as shown and described for FIG. 20b (i.e., double smoothing). The capillary then moves the copper wire toward the second contact region. In the same manner, a conductive ball is formed in the forming chamber and lowered to form a ball bond on the second contact region. The copper wire is subsequently looped from the ball bond at the second contact region toward the first contact region to form a stitch bond on the ball bump. Both tests samples Unit 1 and Unit 2 were formed using the same process.

The test samples Unit 1 and Unit 2 were tested to measure their bond performance using a Dage 4000 bond tester obtained from Dage Holdings Limited. FIG. 23 shows the results of the testing. In particular, bump pull tests were conducted on the first and second contact regions. For example, the bump pull tests on the first contact measured the shear strength of the bump ball (Ball Shear Test on Bump); the bump pull tests on the second contact region measured the shear strength of the ball bonds (Ball Shear Test on Ball). Additionally, stitch pull tests were conducted on the stitch bond on the ball bump in the first contact regions.

As shown in FIG. 23, the average shear strength of the ball bonds for Unit 1 ranges from 25.40 to 28.70 gram force with an average of 26.68 gram force. The average shear strength of the ball bonds for Unit 2 ranges from 24.40 to 27.50 gram force with an average of 25.98 gram force. The average shear strength of the stand-off stitch bonds for Unit 1 ranges from 21.50 to 45.80 gram force with an average of 41.35 gram force. The average shear strength of the stand-off stitch bonds for Unit 2 ranges from 35.70 to 46.70 gram force with an average of 44.04 gram force. The average stitch pull strength of the stand-off stitch bonds for Unit 1 ranges from 18.40 to 19.70 gram force with an average of 18.93 gram force. The average pull strength of the stand-off stitch bonds for Unit 2 ranges from 17.50 to 19.60 gram force with an average of 18.62 gram force.

Typical specifications (SPEC) determining good bond strength are shown in FIG. 23. As is clearly shown, the ball shear strengths obtained are higher than the specification of 17 gram force. The stitch pull strengths obtained are higher than the specification of 7 gram force. The ball sizes obtained are also within the specified ranges as can be seen from FIG. 23.

FIG. 24 shows results of various types of testing on Unit 1 and Unit 2. The Moisture Sensitivity Level test involves the packages undergoing MSL 3 test at 30° C., 60% Room Humidity for 192 hours, and then reflowed 3 times at 260° C. Out of 150 lots of semiconductor packages, only 2 lots failed the test. The Temperature Cycling test involves subjecting the packages through temperature cycles of −55° C. to 125° C. for 500 and 1000 cycles. All of the lots passed the Temperature Cycling test. The High Temperature Storage test involves storing the packages at a temperature of 150° C. for 500 hours and 1000 hours. All of the lots passed the High Temperature Storage test.

Using Cu wire bonding on OSP permits elimination of the process of Ni and Au coating required for Au wire bonding to achieve an acceptable electrical connection between the semiconductor chip and PCB. Cu wire bonding through OSP is not restricted to the coating of OSP on the substrate. The OSP can also be used to coat the bond pads located on the semiconductor chip, thereby allowing the connection of bond pads and PCB through Cu wires. Also, the coating of the OSP on the substrate may be formed on the lead fingers or over the partial or entire surface of the substrate.

Slower inter-metallic growth occurs in Cu wire bonding, as compared to Au wire bonding. This results in lower electrical resistance and lower heat generation. This also enhances the bonding reliability and device performance.

Copper materials have better conductivity as compared to gold materials, thereby increasing device power rating and improving package heat dissipation. This excellent heat dissipation characteristic can prevent the IC from overheating during electrical testing and stress environment testing.

A copper wire exhibits superior manufacturability characteristics, such as higher tensile strength and elongation as compared to gold wire, resulting in improved neck strength, improved wire sagging and wire sweep performance, excellent wire loop profile and stability for long wires during package encapsulation. It provides an excellent alternative for fine pitch package application. The fine pitch refers to the close proximity between 2 adjacent wires when the 2 bonding pads located on the semiconductor chip are very close to one another (e.g., 10 µm spacing between 2 adjacent bond pads).

The SSB process traditionally requires forming gas to be passed over the ball bump using a near vertical tube after it is formed on the contact region to prevent oxidation of the bump which is thought to affect the bond strength of the stitch bond that is to be bonded to the ball bump. The inventors have surprisingly found that the forming gas on the ball bump does not significantly improve bond strength. Advantageously, this can lead to savings in costs associated with the forming gas from the near vertical tube.

The OSP coating serves as an anti-oxidation layer over the chip bond pads (formed of copper, aluminum, silver, etc.) or the substrate. Furthermore, where copper (Cu) wire is bonded to Cu bond pads, owing to its monometallic system, offers better reliability as compared to inter-metallic systems such as gold wire bonded to Al bond pads. However, conventional methods of directly bonding the copper wire to the OSP surface has its problems in that the wire bond may not effectively bond through the OSP to the bond pads or lead fingers. The invention therefore ameliorates this problem by bonding the copper wire to the OSP surface using SSB and/or the smoothing feature. It will be appreciated that this may also be applicable for non-OSP coated surfaces to result in effective bonding of the copper wire to the surface.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing first and second contact regions of the device, wherein the first contact region comprises copper coated with an OSP material;
forming a ball bump on the first contact region, wherein forming the ball bump comprises threading a wire through a capillary of a bonding tool, wherein a tip of the wire is disposed beyond a tip of the capillary,
disposing the capillary in a forming chamber with a forming gas, and
forming a spark in the chamber to form the ball bump on the tip of the wire,
smoothing the ball bump to form a flat top surface on the ball bump that is devoid of a tail, wherein smoothing the ball bump comprises
locating the capillary with the ball bump on the first contact region,
processing to form a ball bump which penetrates the OSP material and is sufficiently bonded to the first contact region,
translating the capillary in a first direction away from the ball bump, and
translating the capillary in a second direction back across the ball bump to form the flat top surface, wherein the translations are along the same angle as the flat surface;
bonding a first end of the wire to the second contact region; and
bonding a second end of the wire to the top surface of the ball bump.

2. The method of claim 1 wherein the device comprises a semiconductor package comprising:
a substrate;
a die attached to the substrate; and
wherein the first contact region comprises a lead finger disposed on the substrate and the second contact region comprises a die bond pad on the die.

3. The method of claim 2 wherein dispensing of forming gas on the ball bump on the first contact region is avoided.

4. The method of claim 3 wherein the wire comprises copper.

5. The method of claim 2 wherein the wire comprises copper.

6. The method of claim 5 wherein dispensing of forming gas on the ball bump on the first contact region is avoided.

7. The method of claim 1 wherein the wire comprises copper.

8. The method of claim 7 wherein dispensing of forming gas on the ball bump on the first contact region is avoided.

9. The method of claim 1 wherein dispensing of forming gas on the ball bump on the first contact region is avoided.

10. The method of claim 9 wherein the wire comprises copper.

11. A method of forming a device comprising:
providing first and second contact regions of the device, wherein the first contact region comprises copper coated with an OSP material;
forming a wire ball bump on the first contact region;
smoothing the ball bump in a lateral direction to form a flat top surface on the ball bump that is devoid of a tail, wherein smoothing the ball bump comprises
processing to form the ball bump which penetrates the OSP material and is sufficiently bonded to the first contact region;
bonding a first end of a wire to the second contact region;
bonding a second end of the wire to the top surface of the ball bump; and
wherein dispensing of forming gas on the ball bump on the first contact region is avoided during bonding of the first and second contact regions.

12. The method of claim 11 wherein the wire comprises copper.

13. The method of claim 11 wherein forming the ball bump comprises:
threading a wire through a capillary of a bonding tool, wherein a tip of the wire is disposed beyond a tip of the capillary;
disposing the capillary in a forming chamber with a forming gas; and
forming a spark in the chamber to form the ball bump on the tip of the wire.

14. The method of claim 11 wherein smoothing the ball bump further comprises
locating a capillary with the ball bump on the first contact region;
translating the capillary in a first lateral direction away from the ball bump; and
translating the capillary in a second lateral direction back across the ball bump to form the flat top surface.

15. The method of claim 11 wherein the flat top surface is formed at an angle to a plane of the first contact region.

* * * * *